(12) United States Patent
Kitaguchi

(10) Patent No.: US 7,652,897 B2
(45) Date of Patent: Jan. 26, 2010

(54) HIGH FREQUENCY UNIT

(75) Inventor: Masanori Kitaguchi, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 520 days.

(21) Appl. No.: 11/357,994

(22) Filed: Feb. 22, 2006

(65) Prior Publication Data

US 2006/0186513 A1    Aug. 24, 2006

(30) Foreign Application Priority Data

Feb. 23, 2005   (JP) .............................. 2005-047402

(51) Int. Cl.
*H05K 9/00* (2006.01)
(52) U.S. Cl. .................. 361/816; 361/818; 361/800
(58) Field of Classification Search .................. 361/760, 361/748, 720, 736, 818, 816; 174/51, 35 R, 174/252–255, 260–264
See application file for complete search history.

(56) References Cited

U.S. PATENT DOCUMENTS

| 4,218,578 | A  | * | 8/1980 | Olschewski et al. ......... 174/372 |
| 4,697,044 | A  | * | 9/1987 | Ishikawa ..................... 174/372 |
| 5,162,971 | A  | * | 11/1992 | Sato et al. ................... 361/816 |
| 5,557,508 | A  | * | 9/1996 | Sato et al. ................... 361/818 |
| 6,195,244 | B1 | * | 2/2001 | Barz .......................... 361/111 |
| 6,716,677 | B2 | * | 4/2004 | Ammar ....................... 438/124 |
| 7,368,666 | B2 | * | 5/2008 | Takeda ........................ 174/260 |

FOREIGN PATENT DOCUMENTS

| JP | 2-36098 | 3/1990 |
| JP | 2000-253677 | 9/2000 |
| JP | 2002-9478 A | 1/2002 |

* cited by examiner

*Primary Examiner*—Hung S Bui
(74) *Attorney, Agent, or Firm*—Birch, Stewart, Kolasch & Birch, LLP

(57) ABSTRACT

A high frequency unit (e.g., an RF signal selection switch) includes, as its external terminals, a terrestrial input terminal, a CATV input terminal, an RF output terminal, a selection signal terminal, a power supply terminal and a ground potential terminal. The external terminals are attached to a shielding case surrounding the peripheral edge of a wiring substrate. The shielding plate is disposed in contact with the rear face of the wiring substrate.

15 Claims, 9 Drawing Sheets

HIGH FREQUENCY UNIT

BACKGROUND OF THE INVENTION

This application claims priority under 35 U.S.C. § 119(a) on Patent Application No. 2005-047402 filed in Japan on Feb. 23, 2005, the entire contents of which are hereby incorporated by reference.

The present invention relates to a high frequency unit that includes a shielding case for shielding a wiring substrate on which a high frequency semiconductor electronic component is mounted.

There have been proposed communication formats for receiving signals in the same frequency band via different communications means. For example, in terrestrial TV broadcasting that uses RF signals as ground waves, a terrestrial CATV (cable antenna TV) receiving format that receives ground waves via CATV and a terrestrial direct receiving format that directly receives ground waves are known. As electronic devices for selecting one of these two formats by switching between them, devices using an RF signal selection switch as a high frequency unit are being used.

FIG. 7(A) and FIG. 7(B) are diagrams schematically illustrating a conventional high frequency unit, with FIG. 7(A) showing its top view, and FIG. 7(B) showing a cross-sectional view taken along the line indicated by the arrows X-X in FIG. 7(A). FIG. 8 is a bottom view of the high frequency unit shown in FIG. 7(A) and FIG. 7(B).

The high frequency unit shown in FIG. 7(A), FIG. 7(B) and FIG. 8 may be, for example, an RF signal selection switch, which includes, as its external terminals, a terrestrial input terminal 101 as a high frequency input terminal, a CATV input terminal 102 as a high frequency input terminal, an RF output terminal 103 as a high frequency output terminal, a selection signal terminal Tsw into which selection signals Ssw are input, a power supply terminal Tcc to which a power supply voltage Vcc is supplied, and a ground potential terminal GND held at ground potential Ve. These external terminals are attached and fixed to a shielding case 104 made of metal (e.g., copper). The shielding case 104 surrounds the peripheral edge of a wiring substrate 105 to provide shielding (electromagnetic wave shielding).

A high frequency relay 115, which is a large mechanical component serving as an RF signal selection circuit, is mounted on the front face of the wiring substrate 105. The selection signal terminal Tsw, the power supply terminal Tcc and the ground potential terminal GND are connected to a wiring pattern (not shown) that is formed on the wiring substrate 105.

A core wire 101L of the terrestrial input terminal 101 and a core wire 102L of the CATV input terminal 102 are connected to the high frequency relay 115, mounted on the front face of the wiring substrate 105, on the rear face of the wiring substrate 105. Further, RF signals that have been selected by the high frequency relay 115 are output to the RF output terminal 103 via a broadband amplifier 116 (see FIG. 9) and a core wire 103L.

The wiring substrate 105 can be divided into a terrestrial input block BL-A as a block corresponding to the terrestrial input terminal 101, a CATV input block BL-B as a block corresponding to the CATV input terminal 102, and an RF output block BL-C as a block corresponding to the RF output terminal 103.

The shielding case 104 contains shield separation plates 104w and 104p for separating the terrestrial input block BL-A, the CATV input block BL-B and the RF output block BL-C from one another. On the rear face of the wiring substrate 105, a shield separation plate 104q for separating the terrestrial input block BL-A and the CATV input block BL-B is attached afterwards as a discrete component. Further, leg portions 104b of the shield separation plate 104w are formed protruding to the rear face of the wiring substrate 105. To the shielding case 104, a shielding lid 104ra is attached on the front face side of the wiring substrate 105, and a shielding lid 104rb is attached on the rear face side.

FIG. 9 is a block diagram showing a circuit block of the high frequency unit shown in FIG. 7(A), FIG. 7(B) and FIG. 8. Components identical to those shown in FIG. 7(A), FIG. 7(B) and FIG. 8 are given identical reference numerals, and their description has been omitted where appropriate.

The circuit block shown in FIG. 9 includes, as its main components, a high frequency relay 115 and a broadband amplifier 116 that are mounted on the wiring substrate 105. The high frequency relay 115 selects RF signals from the terrestrial input terminal 101 and the CATV input terminal 102. The broadband amplifier 116 amplifies the selected RF signals, and outputs them from the RF output terminal 103. The high frequency relay 115 is connected, for example, to a selection signal terminal Tsw into which selection signals Ssw are input, and a power supply terminal Tcc to which a power supply voltage Vcc is supplied. The broadband amplifier 116 is connected, for example, to the power supply terminal Tcc.

When the selection signal Ssw input into the selection signal terminal Tsw is a signal selecting the terrestrial direct receiving format, the high frequency relay 115 is connected to a terminal 120. That is, the RF signals from the terrestrial input terminal 101 will be output from the RF output terminal 103. On the other hand, when the selection signal Ssw input into the selection signal terminal Tsw is a signal selecting the terrestrial CATV receiving format, the high frequency relay 115 is connected to a terminal 121. That is, the RF signals from the CATV input terminal 102 will be output from the RF output terminal 103.

As an electronic unit including an electromagnetic wave shielding plate, an electronic unit is known in which an electromagnetic wave shielding plate is attached onto an electronic circuit board (see e.g., JP2002-9478A).

Since the terrestrial CATV receiving format that receives ground waves via CATV and the terrestrial direct receiving format that directly receives ground waves use RF signals in the same frequency band, the RF signal selection switch is required to have very high isolation properties so that the signals will not cause interference.

However, although the high frequency relay as a single component can achieve favorable isolation, it is expensive and has a large size, which has been the cause of preventing its cost reduction and miniaturization. Further, due to its large size, it has been difficult to completely separate input terminals of the high frequency relay on the front face of the wiring substrate, using a shielding plate.

Additionally, although it is necessary to use a rigid isolation structure also on the rear face of the wiring substrate to prevent isolation degradation resulting from radiation from the lead (core wire) portion of the frequency relay and the RF input/output terminals, it has been difficult to mount a complex shielding plate having excellent shielding properties due to cost and workability reasons. This has led to reduction in product quality and yields.

The present invention was made in view of such circumstances, and it is an object of the present invention to provide a highly reliable, low-cost high frequency unit that can provide reliable shielding, has a simple structure, is easy to manufacture and can achieve miniaturization and high performance.

SUMMARY OF THE INVENTION

A high frequency unit according to the present invention includes: a wiring substrate that includes a high frequency semiconductor electronic component mounted on its front face; a shielding case that surrounds the wiring substrate to shield the wiring substrate; and a shielding plate that contacts a rear face of the wiring substrate to shield the wiring substrate.

With this configuration, the wiring substrate is shielded with the shielding case surrounding the peripheral edge of the wiring substrate and the shielding plate disposed in contact with the rear face of the wiring substrate, so that it is possible to realize a highly reliable, low-cost high frequency unit that can provide reliable shielding, has a simple structure, can be readily manufactured and can achieve miniaturization and high performance.

In the high frequency unit according to the present invention, a resist film for covering a wiring pattern on the rear face of the wiring substrate may be formed on the rear face of the wiring substrate, and the shielding plate may contact the wiring substrate via the resist film.

With this configuration, it is possible to provide shielding while ensuring isolation between the shielding plate and the wiring pattern on the rear face of the wiring substrate (a double-sided wiring substrate having wiring patterns on both sides).

In the high frequency unit according to the present invention, a spacer may be formed on the resist film, and the shielding plate may contact the wiring substrate via the spacer.

With this configuration, it is possible to prevent short circuit failure caused by scratching or the like of the resist film from occurring between the shielding plate and the wiring pattern on the rear face of the wiring substrate, thus increasing the margin of quality and improving reliability.

In the high frequency unit according to the present invention, a ground land wiring may be provided on the wiring substrate, a shielding plate opening may be provided in the shielding plate, an opening protrusion may be provided in the shielding plate opening, and the shielding plate and the ground land wiring may be bonded via the opening protrusion.

With this configuration, a portion that is to be bonded can be identified and thus easily confirmed visually, so that it is possible to reliably bond the shielding plate and the ground land wiring.

In the high frequency unit according to the present invention, the opening protrusion may be coplanar with the shielding plate.

With this configuration, the opening protrusion is coplanar with the shielding plate, so that it is possible to readily and reliably bond the shielding plate and the ground land wiring.

In the high frequency unit according to the present invention, a resist film opening may be formed on an outer circumference of the ground land wiring, and the shielding plate opening may be disposed on an outer circumference of the resist film opening.

With this configuration, it is easy to visually confirm the connection state between the ground land wiring and the opening protrusion, making it possible to reliably bond the ground land wiring and the opening protrusion.

In the high frequency unit according to the present invention, opening protrusion may extend inward into the resist film opening.

With this configuration, it is possible to readily and reliably bond the ground land wiring and the opening protrusion, and reliable bonding of the ground land wiring and the shielding plate enables reliable shielding on the rear face of the wiring substrate.

In the high frequency unit according to the present invention, the shielding case may be provided with a leg portion passing through the wiring substrate, and the opening protrusion may be bonded to the leg portion of the shielding case.

With this configuration, the shielding case (the leg portion) is bonded to the shielding plate (the opening protrusion), so that the shielding case is reliably fixed to the wiring substrate, and the wiring substrate is shielded by the shielding case and the shielding plate sandwiching the wiring substrate from both sides. Accordingly, it is possible to reliably shield the wiring substrate.

The high frequency unit according to the present invention may further include a fitting portion for fitting the shielding plate and the shielding case each other.

With this configuration, the shielding plate can be readily attached to the shielding case by fitting the shielding plate and the shielding case each other, thus making it possible to reliably shield the wiring substrate.

In the high frequency unit according to the present invention, the fitting portion may be composed of a fitting protrusion and a slit, the fitting protrusion may be formed at the periphery of the shielding plate, and the slit may be formed in the shielding case into which the fitting protrusion is fitted.

With this configuration, the shielding plate and the shielding case can be readily and reliably fitted each other by forming the fitting portion by a combination of the protrusion and the slit.

In the high frequency unit according to the present invention, the fitting protrusion and the slit may be bonded.

With this configuration, since the fitting protrusion (the shielding plate) and the slit (the shielding case) are bonded, it is possible to reliably fix and fasten the shielding plate and the shielding case to reliably shield the wiring substrate, thus improving the reliability.

In the high frequency unit according to the present invention, the shielding plate may include a heat radiating opening at a position corresponding to the fitting protrusion.

With this configuration, it is possible to decrease the thermal capacity at the time of bonding the fitting protrusion and the slit (i.e., to increase the heat radiating effect of the heat radiating opening), thus improving the operation quality when bonding.

In the high frequency unit according to the present invention, the shielding case may include a tongue portion, and the shielding case may fix the shielding plate with the tongue portion.

With this configuration, the shielding plate can be fixed by bending the tongue portion of the shielding case (made of metal) and pressing the shielding plate with the tongue portion, so that it is possible to reliably fix the shielding plate to the wiring substrate.

In the high frequency unit according to the present invention, a core wire of each of a high frequency input terminal and a high frequency output terminal may be attached to the shielding case, and the core wire of each of the high frequency input terminal and the high frequency output terminal may be bonded to a wiring pattern formed on the front face of the wiring substrate.

With this configuration, the core wire of the high frequency input terminal and the core wire of the high frequency output terminal are bonded to the wiring pattern formed on the front face of the wiring substrate, so that the leads (core wires) handling high frequency signals will not be arranged on the rear face of the wiring substrate. Accordingly, it is possible to prevent deterioration in isolation and shielding properties resulting from unnecessary radiation, thus providing a high frequency unit with excellent shielding properties.

In the high frequency unit according to the present invention, the shielding case may include a shielding lid for shielding the wiring substrate on the front face side of the wiring substrate.

With this configuration, the shielding lid provided on the open portion (the front face side of the wiring substrate) of the shielding case can provide reliable shielding for the wiring substrate, together with the shielding plate (and the shield separation plate) on the rear face side.

In the high frequency unit according to the present invention, the high frequency semiconductor electronic component may be a microwave monolithic integrated circuit.

With this configuration, it is not necessary to use a large mechanical component such as a high frequency relay, so that the components can be surface-mounted, and the high frequency leads will not be extended onto the rear face of the wiring substrate. Accordingly it is possible to achieve miniaturization, low power consumption and high performance, thus realizing a low-cost high frequency unit.

In the high frequency unit according to the present invention, the microwave monolithic integrated circuits may constitute an RF signal selection circuit.

With this configuration, the RF signal selection switch is formed by an electronic circuit (RF signal selection circuit), so that it can be mounted on a single side of the wiring substrate, making it possible to realize a miniaturized high frequency unit (RF signal selection switch). That is, the microwave monolithic integrated circuit constitutes the RF signal selection circuit, so that it is possible to provide a high frequency unit that is particularly useful as an RF signal selection switch used for TV, VTR and the like.

DESCRIPTION OF THE PREFERRED EMBODIMENTS

Hereinafter, embodiments of the present invention will be described in detail with reference to the accompanying drawings.

Embodiment 1

Figure 1:
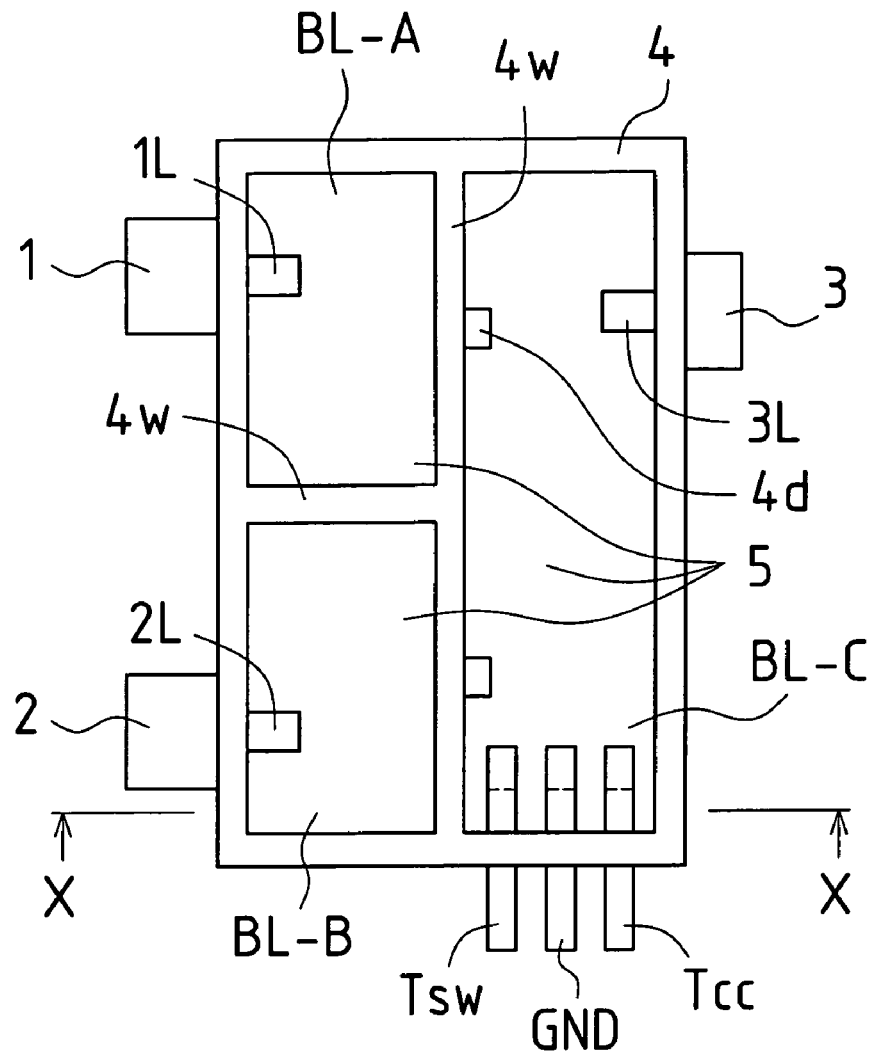
FIG. 1(A) and FIG. 1(B) are diagrams schematically illustrating a high frequency unit according to Embodiment 1 of the present invention, with FIG. 1(A) showing its top view, and FIG. 1(B) showing a cross-sectional view taken along the line indicated by the arrows X-X in FIG. 1(A).
Figure 2:
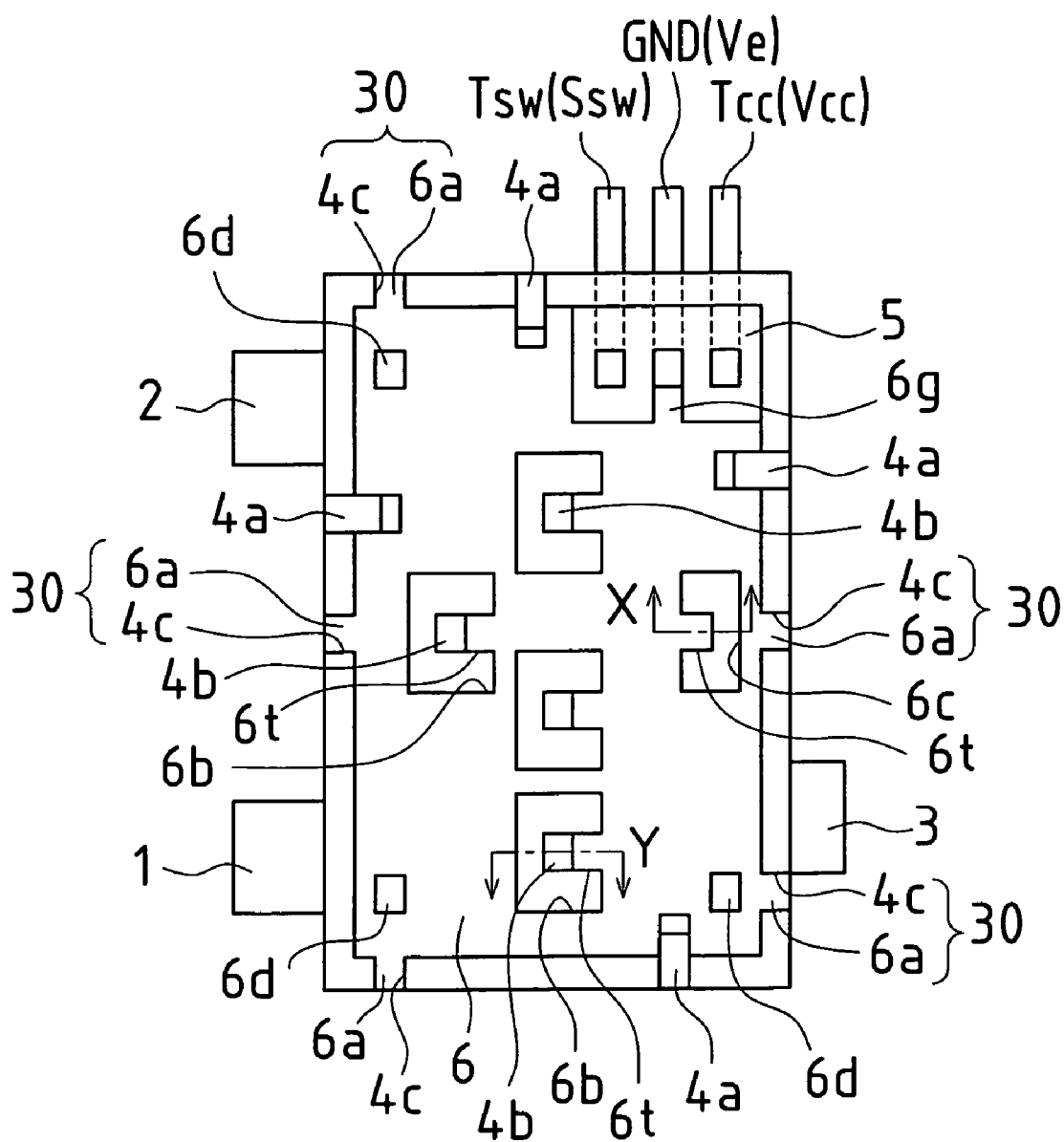
FIG. 2 is a bottom view of the high frequency unit shown in FIG. 1(A) and FIG. 1(B).

FIG. 1(A) and FIG. 1(B) are diagrams schematically illustrating a high frequency unit according to Embodiment 1 of the present invention, with FIG. 1(A) showing its top view, and FIG. 1(B) showing a cross-sectional view taken along the line indicated by the arrows X-X in FIG. 1(A). FIG. 2 is a bottom view of the high frequency unit shown in FIG. 1(A) and FIG. 1(B).

The high frequency unit shown in FIG. 1(A), FIG. 1(B) and FIG. 2 may be, for example, an RF signal selection switch, which includes, as its external terminals, a terrestrial input terminal 1 as a high frequency input terminal, a CATV input terminal 2 as a high frequency input terminal, an RF output terminal 3 as a high frequency output terminal, a selection signal terminal Tsw into which selection signals Ssw are input, a power supply terminal Tcc to which a power supply voltage Vcc is supplied, and a ground potential terminal GND, which is held at ground potential Ve. These external terminals are attached and fixed to a shielding case 4 made of metal (e.g., copper). The shielding case 4 is disposed surrounding the peripheral edge of a wiring substrate 5, and serves as shielding (electromagnetic wave shielding) means.

High frequency semiconductor electronic components (not shown) are mounted (connected) onto the front face of the wiring substrate 5. The terrestrial input terminal 1, the CATV input terminal 2, the RF output terminal 3, the selection signal terminal Tsw, the power supply terminal Tcc and the ground potential terminal GND are connected to the high frequency semiconductor electronic components via a wiring pattern (not shown) formed on the front face of the wiring substrate 5.

A core wire 1L of the terrestrial input terminal 1, a core wire 2L of the CATV input terminal 2 and a core wire 3L of the RF output terminal 3 are bonded (e.g., soldered) to the wiring pattern (not shown) formed on the front face of the wiring substrate 5. That is, the leads handling high frequency signals (the core wire 1L, the core wire 2L and the core wire 3L) are not exposed on the rear face of the wiring substrate 5, so that it is possible to prevent isolation failure and unnecessary degradation of radiation, thus realizing a high frequency unit with high performance.

The wiring substrate 5 can be divided into a terrestrial input block BL-A as a block corresponding to the terrestrial input terminal 1, a CATV input block BL-B as a block corresponding to the CATV input terminal 2 and an RF output block BL-C as a block corresponding to the RF output terminal 3.

The shielding case 4 contains a shield separation plate 4w for separating the terrestrial input block BL-A, the CATV input block BL-B and the RF output block BL-C from one another. The bottom portion (the bottom end portion) of the shield separation plate 4w is disposed in contact with the wiring substrate, except for a portion of the wiring pattern connecting the blocks, and the top portion (the upper end portion) of the shield separation plate 4w is disposed in conformity to the top portion of the shielding case 4. Since the bottom portion of the shield separation plate 4w is configured to be in contact with the wiring substrate, it is possible to reliably achieve isolation between the terrestrial input block BL-A, the CATV input block BL-B and the RF output block BL-C, thus improving the reliability of the shielding case 4.

Although the power supply terminal Tcc, the ground potential terminal GND and the selection signal terminal Tsw are formed by relatively inexpensive insertion components having favorable strength, they act as ground potential in terms of high frequency, so that there will be no isolation degradation. Needless to say, the power supply terminal Tcc, the ground potential terminal GND and the selection signal terminal Tsw may also be formed by SMT (surface mount) components. Additionally, a shielding plate 6 is connected to the ground potential terminal GND (see the connection between the ground potential terminal GND and a GND protrusion 6g in FIG. 2).

The shielding plate 6 is disposed in contact with the rear face of the wiring substrate 5, and fixed with tongue portions 4a that are formed in the shielding case 4 such that it faces the rear face of the wiring substrate 5. The tongue portions 4a are formed integrally as a part of the shielding case 4 at the time of forming the shielding case 4. Since the shielding case 4 is made of metal, the tongue portions 4a are bendable. By bending the tongue portions 4a appropriately, the shielding plate 6 can be pressed against the rear face of the wiring substrate 5, so that the shielding plate 6 can be tightly attached to (closely contacted with) the rear face of the wiring substrate 5.

In the shielding case 4, leg portions 4b that extend from the front face through the rear face of the wiring substrate 5 are formed extending from the shield separation plate 4w. The wiring substrate 5 is suitably provided with through holes 5t (see FIG. 5) through which the leg portions 4b are passed. Further, a connecting portion 4d for connecting with the wiring pattern (a ground land wiring 7ef (see FIG. 5)) formed on the front face of the wiring substrate 5 is formed extending from the shield separation plate 4w. It should be noted that the ground land wiring 7ef and a ground land wiring 7er (see FIG. 5) are wiring patterns for holding the ground potential, and they are both referred to as "ground land wirings 7e" where it is not necessary to differentiate between the ground land wiring 7ef and the ground land wiring 7er.

Each slit 4c formed in the shielding case 4 and each fitting protrusion 6a of the shielding plate 6 form a fitting portion 30 where they are fitted each other, making it possible to fit the shielding case 4 with the shielding plate 6, easily and reliably. In other words, it is possible to readily attach the shielding plate 6 to the shielding case 4. The slits 4c are formed by appropriately cutting slits in the shielding case 4 from its lower open end (the end portion on the rear face side of the wiring substrate 5) to a position corresponding to the shielding plate 6. The fitting protrusions 6a are formed by extending the shielding plate 6 in conformity with the slits 4c.

At the fitting portions 30, the shielding case 4 (the slits 4c) and the shielding plate 6 (the fitting protrusions 6a) are appropriately bonded (e.g., soldered), and thereby the shielding case 4 and the shielding plate 6 are fixed and fastened. Accordingly, the shielding case 4 and the shielding plate 6 will be conducted with each other, making it possible to reliably shield the wiring substrate 5.

Heat radiating openings 6d having an area sufficient to radiate heat are formed in the shielding plate 6 at positions corresponding to (suitable positions in the vicinity of) the fitting protrusions 6a. The heat radiating openings 6d increase the heat radiating effect when bonding (soldering) the slits 4c and the fitting protrusions 6a, thus decreasing the thermal capacity and improving the operation quality at the time of bonding.

Shielding plate openings 6b and 6c are formed in the shielding plate 6. Each of the shielding plate openings 6b and 6c has an opening protrusion 6t that is formed protruding inward from the periphery of the opening. The shielding plate openings 6b are formed so as to allow the leg portions 4b of the shielding case 4 (the shield separation plate 4w) to pass therethrough and to bond (e.g., solder) the opening protrusions 6t formed at the shielding plate openings 6b, the leg portions 4b of the shield separation plate 4w and the ground land wiring 7er (see FIG. 5) of the wiring substrate 5 one another. The shielding plate opening 6c is formed so as to allow the opening protrusion 6t and the ground land wiring 7e (see FIG. 4) to be bonded (e.g., soldered) each other in an area through which the leg portions 4b do not have to be passed.

Figure 7:
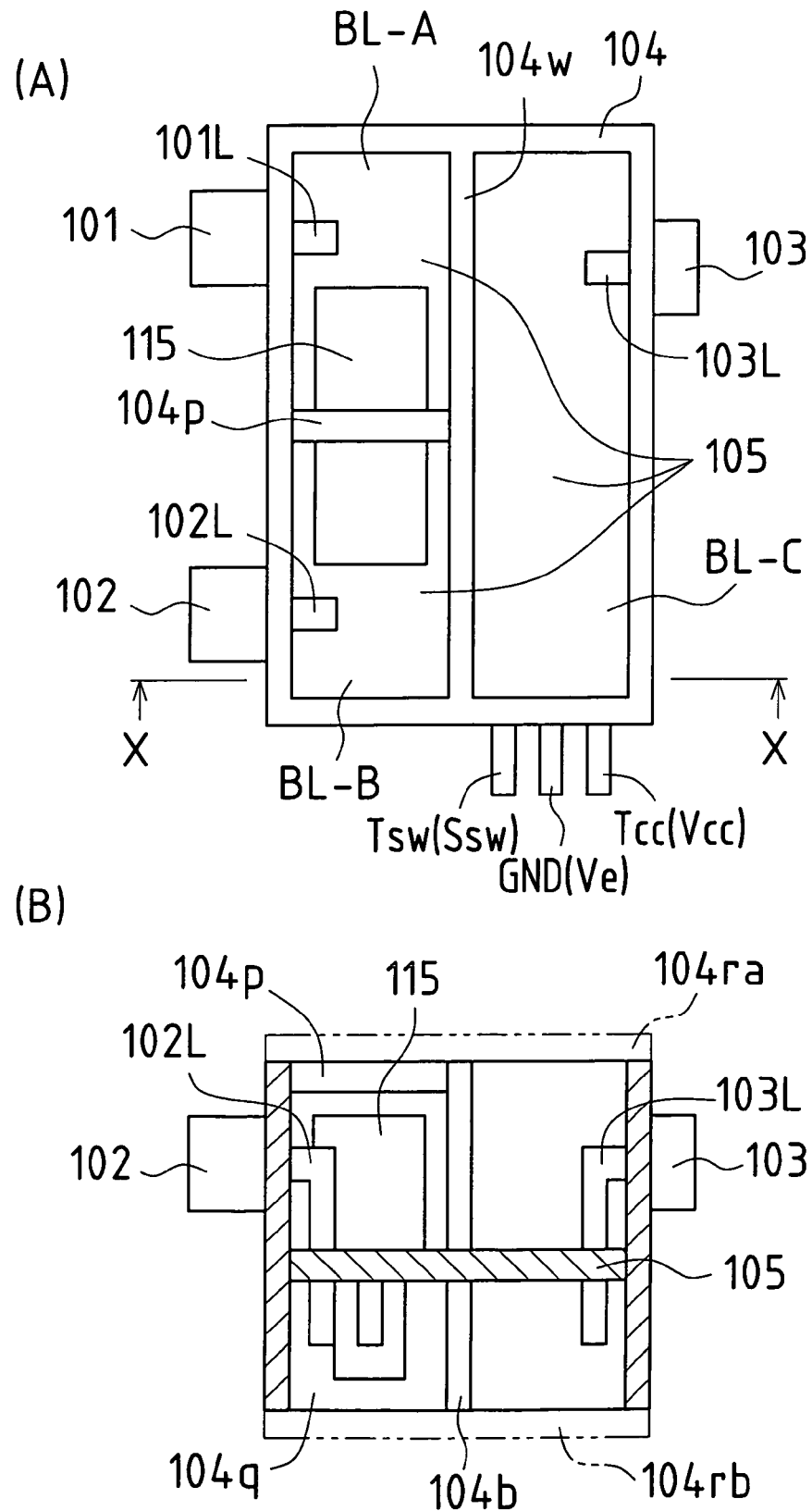
FIG. 7(A) and FIG. 7(B) are diagrams schematically illustrating a conventional high frequency unit, with FIG. 7(A) showing its top view, and FIG. 7(B) showing a cross-sectional view taken along the line indicated by the arrows X-X in FIG. 7(A).
Figure 8:
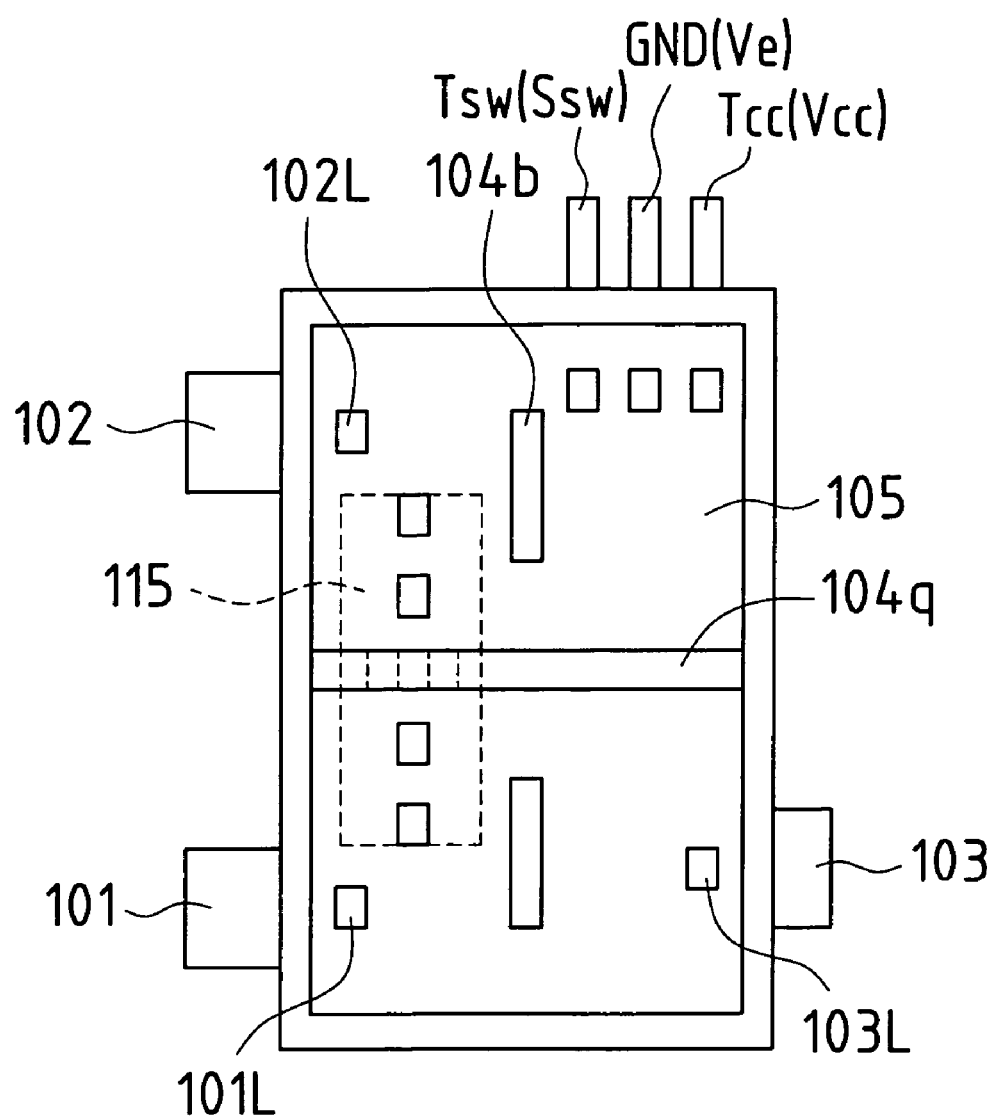
FIG. 8 is a bottom view of the high frequency unit shown in FIG. 7(A) and FIG. 7(B).
Figure 9:
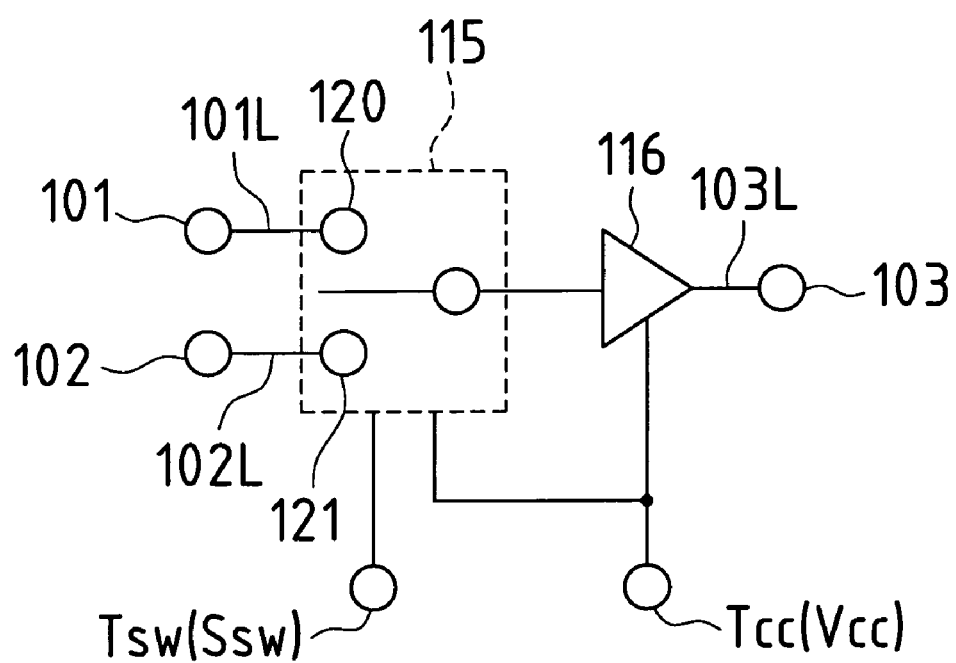
FIG. 9 is a block diagram showing a circuit block of the high frequency unit shown in FIG. 7(A), FIG. 7(B) and FIG. 8.

A shielding lid 4r can be attached to the upper open end (the end portion on the front face side of the wiring substrate 5) of the shielding case 4. The shielding lid 4r, together with the shielding plate 6 on the rear face side of the wiring substrate 5, can reliably shield the wiring substrate 5. While a shielding lid can be similarly provided at the lower open end of the shielding plate 4 (the end portion on the rear face side of the wiring substrate 5), the need for this will be small, since the shielding plate 6 will shield most part of the wiring substrate 5. That is, the shielding plate 6 can also serve as the shielding lid on the rear face side of the wiring substrate 5, so that it is possible to simplify the structure and the production process. Furthermore, the shield separation plate (see a shield separation plate 104q in FIG. 7(B)) on the rear face side of the wiring substrate 5 can be omitted, which can also simplify the production process.

It is preferable that the shielding plate 6 has an area equal to or greater than 30% of the area of each of the terrestrial input block BL-A, the CATV input block BL-B and the RF output block BL-C of the wiring substrate 5. When the shielding plate 6 has an area equal to or greater than 30% of each of these blocks, it is possible to achieve a suitable shielding effect. Furthermore, it is more preferable that the shielding plate 6 has an area equal to or greater than 50% of the each of the terrestrial input block BL-A, the CATV input block BL-B and the RF output block BL-C of the wiring substrate 5.

Since the high frequency unit according to the present invention performs reliable shielding using the shielding case 4 surrounding the peripheral edge of the wiring substrate 5, and the shielding plate 6 disposed in contact with the rear face of the wiring substrate 5, it is possible to realize a high frequency unit with high performance that has a simple structure and can be readily manufactured.

Figure 3:
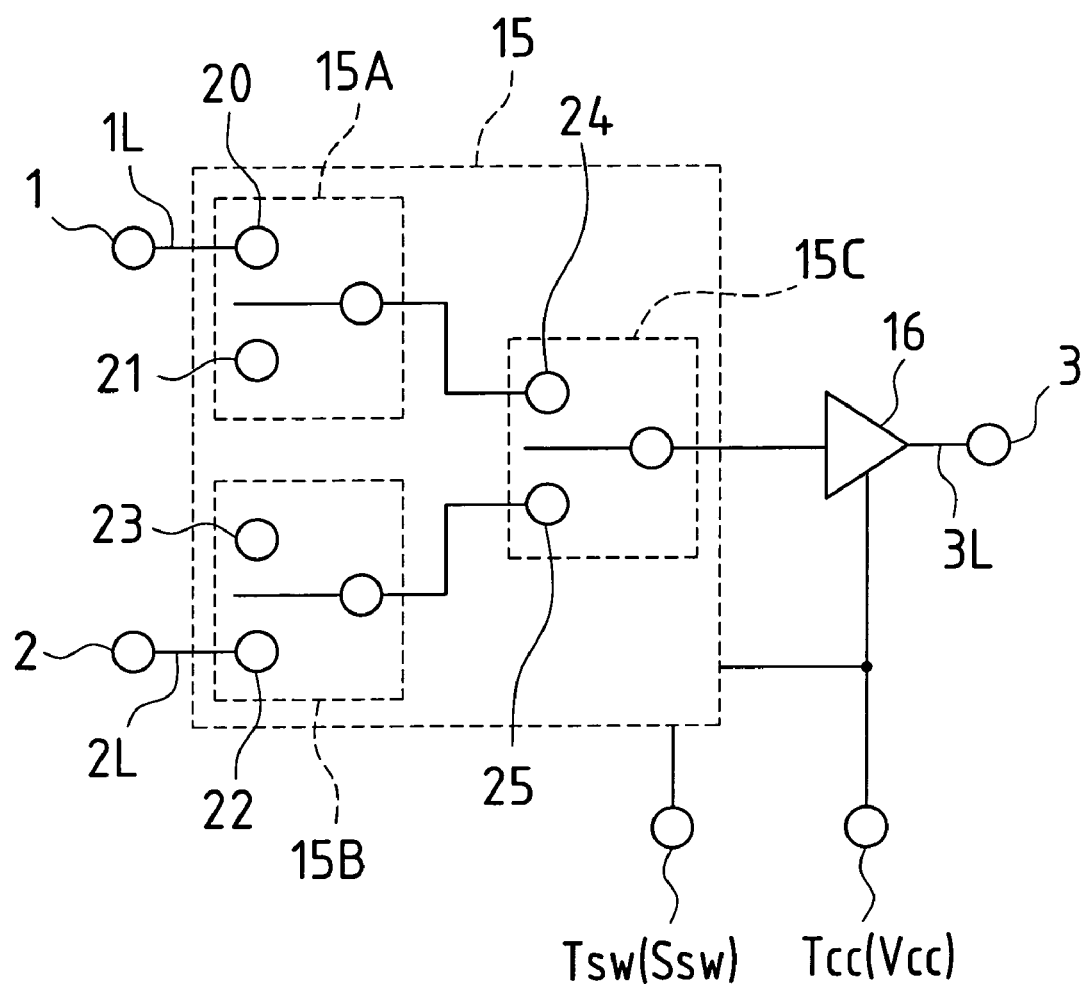
FIG. 3 is a block diagram showing a circuit block of high frequency semiconductor electronic components included in the high frequency unit shown in FIG. 1(A), FIG. 1(B) and FIG. 2.

FIG. 3 is a block diagram showing a circuit block of high frequency semiconductor electronic components that are included in the high frequency unit shown in FIG. 1(A), FIG. 1(B) and FIG. 2. Components identical to those shown in FIG. 1(A), FIG. 1(B) and FIG. 2 are given identical reference numerals, and their description has been omitted where appropriate.

The circuit block shown in FIG. 3 represents an RF signal selection switch serving as a high frequency unit. The RF signal selection switch includes, as its main components, high frequency semiconductor electronic components that are mounted on the front face of the wiring substrate 5. The high frequency semiconductor electronic components are constituted, for example, by an RF signal selection circuit 15 that selects RF signals from the terrestrial input terminal 1 and the CATV input terminal 2, and a broadband amplifier 16 that amplifies the selected RF signals and outputs them from the RF output terminal 3. The RF signal selection switch may be further provided, for example, with a selection signal terminal Tsw into which selection signals Ssw are input, and a power supply terminal Tcc to which a power supply voltage Vcc is supplied.

The RF signal selection circuit 15 includes a terrestrial input switch 15A (disposed corresponding to the terrestrial input block BL-A), a CATV input switch 15B (disposed corresponding to the CATV input block BL-B) and a selection switch 15C (disposed corresponding to the RF output block BL-C). Each of the terrestrial input switch 15A, the CATV input switch 15B and the selection switch 15C is formed by an SPDT (single pole double throw) switch (SPDT SW).

When the selection signal Ssw input to the selection signal terminal Tsw is a signal selecting the terrestrial direct receiving format, the terrestrial input switch 15A is connected to a terminal 20, the CATV input switch 15B is connected to a terminal 23, and the selection switch 15C is connected to a terminal 24. Accordingly, the RF signal from the terrestrial input terminal 1 will be output from the RF output terminal 3. On the other hand, when the selection signal Ssw input to the selection signal terminal Tsw is a signal selecting the terrestrial CATV receiving format, the terrestrial input switch 15A is connected to a terminal 21, the CATV input switch 15B is connected to a terminal 22 and the selection switch 15C is connected to a terminal 25. Accordingly, the RF signal from the CATV input terminal 2 will be output from the RF output terminal 3.

Each of the terrestrial input switch 15A, the CATV input switch 15B and the selection switch 15C as the high frequency semiconductor electronic components is formed by a GaAs (gallium arsenic) MMIC (microwave monolithic IC). That is, the RF signal selection circuit 15 is constituted by three MMICs.

Accordingly, by forming the RF signal selection circuit 15 by three GaAs MMIC SPDT SWs, it is possible to replace a high frequency relay, which is a large mechanical component, with small SMT components (surface mount components), and to mount them on a single side of the wiring substrate 5, without causing deterioration in isolation. Consequently, it is possible to realize miniaturization, low electric consumption and high performance, thus providing a low-cost high frequency unit (RF signal selection switch) by a simplified manufacturing process.

Figure 4:
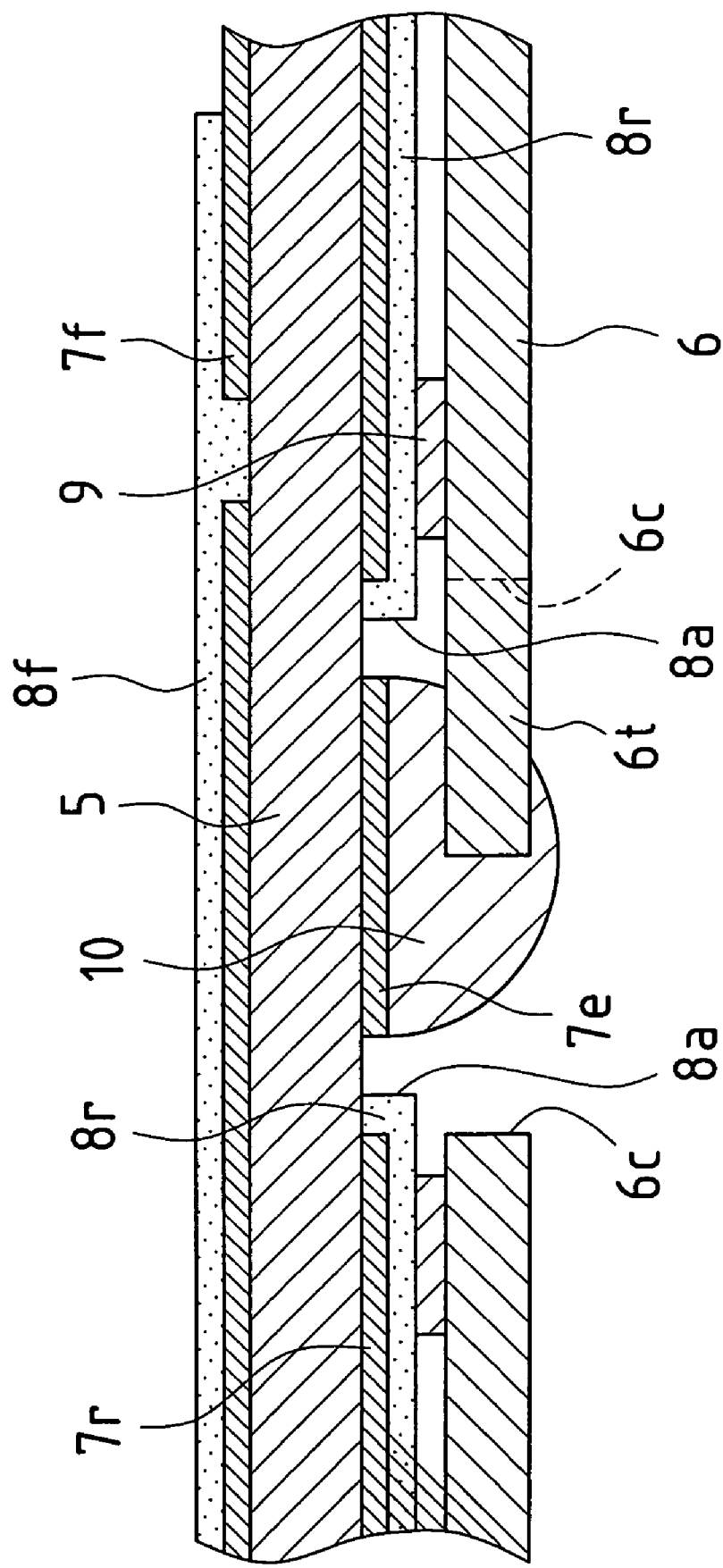
FIG. 4 is a partial cross-sectional view schematically illustrating an example of the connection state between a wiring substrate and a shielding plate in the high frequency unit shown in FIG. 1(A), FIG. 1(B) and FIG. 2.

FIG. 4 is a partial cross-sectional view schematically illustrating an example of the connection state between a wiring substrate and a shielding plate in the high frequency unit shown in FIG. 1(A), FIG. 1(B) and FIG. 2. Components identical to those shown in FIG. 1(A), FIG. 1(B) and FIG. 2 are given identical reference numerals, and their description has been omitted where appropriate. FIG. 4 shows a connection state between the wiring substrate 5 and the shielding plate 6 for a shielding plate opening 6c that is formed in an area of the shielding plate 6 through which the leg portion 4b does not have to be passed (the area indicated by the arrows X in FIG. 2).

A wiring pattern 7f is formed on the front face of the wiring substrate 5, and a wiring pattern 7r is formed on the rear face of the wiring substrate 5 (where it is not necessary to differentiate between the wiring pattern 7f and the wiring pattern 7r, they are both referred to as "wiring patterns 7"). That is, the wiring substrate 5 is formed as a double-sided wiring substrate. The wiring pattern 7f is formed in a suitable pattern, to which high frequency electronic components are mounted, and the core wire 1L of the terrestrial input terminal 1, the core wire 2L of the CATV input terminal 2 and the core wire 3L of the RF output terminal 3, for example, are connected. The wiring pattern 7r is formed in a suitable pattern, and a ground land wiring 7e serving as the wiring pattern for the ground potential is formed in a desired area of the wiring pattern 7r.

A resist film 8f for protecting the wiring pattern 7f is formed on the front face of the wiring pattern 7f by coating. In addition, a resist film 8r for protecting the wiring pattern 7r is formed on the front face of the wiring pattern 7r by coating (where it is not necessary to differentiate between the resist film 8f and the resist film 8r, they are both referred to as "resist films 8"). The resist film 8r enables shielding while ensuring insulation between the shielding plate 6 and the wiring pattern 7r.

Spacers 9 are arranged on the front face of the resist film 8r. Each of the spacers 9 can be formed by silk screen printing a suitable insulating material, and maintains insulation between the wiring substrate 5 and the shielding plate 6, thus ensuring a margin of quality when the resist film 8r has a defect such as scratches. By providing the spacers 9 in at least three positions such that they form a triangle with an appropriate size, it is possible to reliably maintain insulation between the wiring substrate 5 and the shielding plate 6. If the resist film 8r has no quality problem, then the resist film 8r and the shielding plate 6 may be contacted (tightly attached) without providing the spacer 9. When the wiring pattern 7r and the shielding plate 6 are contacted via the resist film 8r, the heat radiating effect of the shielding plate 6 is greater than when the spacer 9 is provided.

The opening protrusion 6t, which is formed in a plane of the shielding plate openings 6c such that it is coplanar with the shielding plate 6, is bonded to the ground land wiring 7e with solder 10, so that the shielding plate 6 can be held at the ground potential. Accordingly, it is possible to shield the wiring substrate 5 on the rear face side. Furthermore, the opening protrusion 6t protrudes from the inner circumference of the shielding plate openings 6c, so that the portion that is to be bonded to the ground land wiring 7e can be clearly defined and therefore easily confirmed visually, thus making it possible to reliably bond the shielding plate 6 and the ground land wiring 7e. Since the opening protrusion 6t is formed coplanar with the shielding plate 6, it is possible to readily bond the shielding plate 6 to the ground land wiring 7e, with the shielding plate 6 contacting (tightly attached to) the resist film 8r.

The shielding plate opening 6c is formed such that it is positioned on the outer circumference of a resist film opening 8a formed on the outer circumference of the ground land wiring 7e, so that it is easy to visually confirm the connection state between the ground land wiring 7e and the opening protrusion 6t, making it possible to reliably bond the ground land wiring 7e and the opening protrusion 6t. Furthermore, since the opening protrusion 6t extends inward into the resist film opening 8a, the ground land wiring 7e and the opening protrusion 6t can be bonded reliably. Accordingly, it is possible to bond only the opening protrusion 6t to the ground land wiring 7e.

Figure 5:
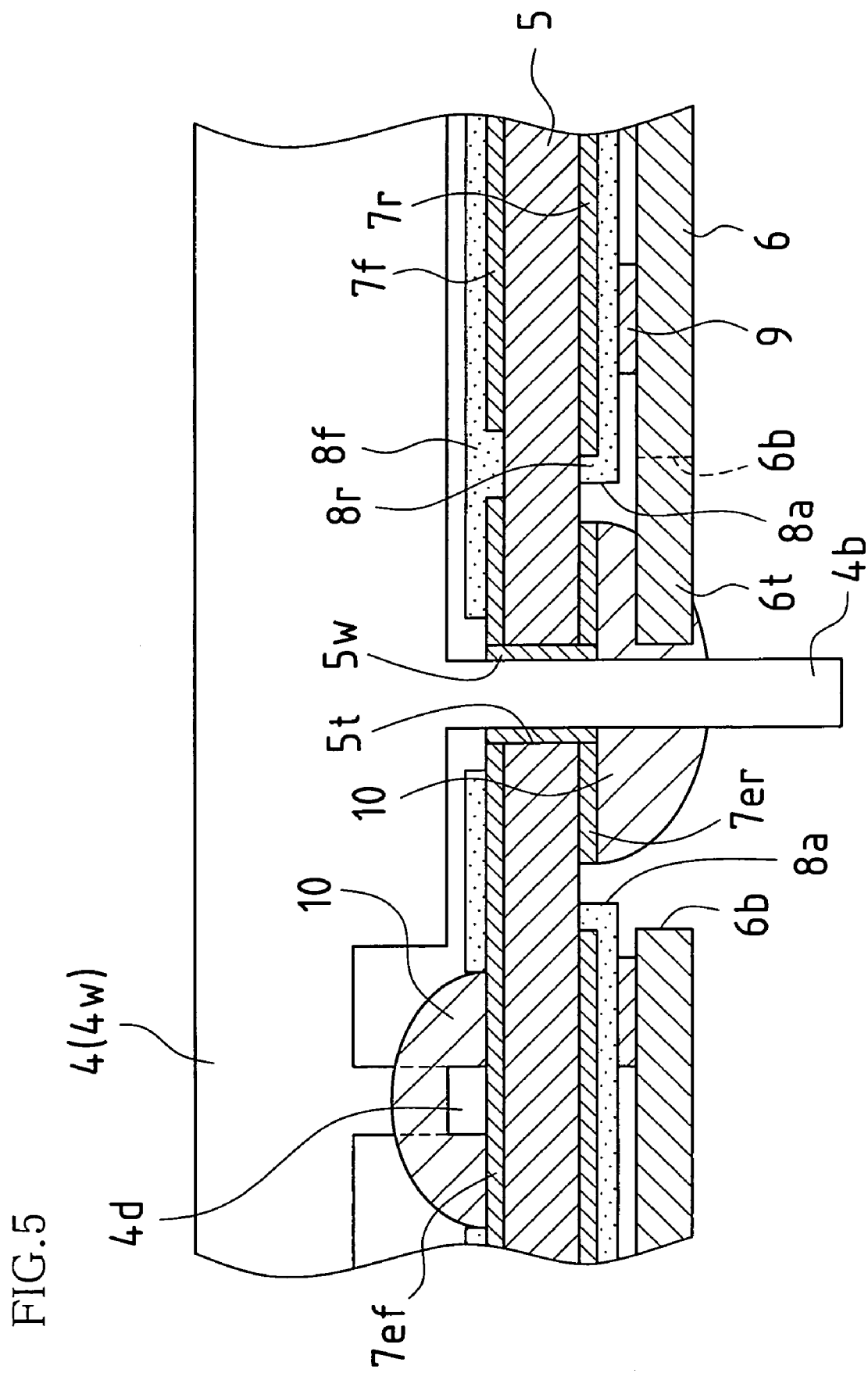
FIG. 5 is a partial cross-sectional view schematically illustrating an example of the connection state between a wiring substrate and a shielding plate in the high frequency unit shown in FIG. 1(A), FIG. 1(B) and FIG. 2.

FIG. 5 is a partial cross-sectional view schematically illustrating an example of the connection state between a wiring substrate and a shielding plate in the high frequency unit shown in FIG. 1(A), FIG. 1(B) and FIG. 2. Components identical to those shown in FIG. 1(A), FIG. 1(B) and FIG. 2 are given identical reference numerals, and their description has been omitted where appropriate. FIG. 5 shows a connection state between the wiring substrate 5 and the shielding plate 6 for a shielding plate opening 6b that is formed in the shielding plate 6 in an outer circumferential area of the through hole 5t through which the leg portion 4b is passed (the connection state in an area indicated by the arrows Y in FIG. 2). That is, this connection state is different from that shown in FIG. 4 in that the leg portion 4b and the through hole 5t are present. Components identical to those shown in FIG. 4 are given identical reference numerals, and their description has been omitted where appropriate.

The ground land wiring 7ef is formed on the front face of the wiring substrate 5, the ground land wiring 7er is formed on the rear face of the wiring substrate 5. The leg portion 4b of the shielding case 4 (the shield separation plate 4w) passes through the through hole 5t formed in the wiring substrate 5, the ground land wiring 7ef and the ground land wiring 7er, and extends from the front face side to the rear face side of the wiring substrate 5. A through hole conductor 5w is formed in the through hole 5t, thus conductively connecting the ground land wiring 7ef and the ground land wiring 7er to provide reliable shielding.

The leg portion 4b of the shielding case 4 (the shield separation plate 4w) is bonded with the solder 10 to the opening protrusion 6t and the ground land wiring 7er on the rear face of the wiring substrate 5. Consequently, the shielding case 4 is bonded to the shielding plate 6 (the opening protrusion 6t) disposed on the rear face of the wiring substrate 5, thus reliably fixing the shielding case 4 (the shield separation plate 4w) to the wiring substrate 5 and achieving a structure capable of providing shielding by sandwiching the wiring substrate 5 by the shielding case 4 and the shielding plate 6 from both sides. Accordingly, it is possible to shield the wiring substrate 5 reliably.

The ground land wiring 7ef is bonded with the solder 10 to the connecting portion 4d of the shielding case 4 (the shield separation plate 4w) on the front face of the wiring substrate 5. Consequently, it is possible to let the shielding case 4 (the shield separation plate 4w) reliably function on the front face side of the wiring substrate 5.

In the high frequency unit of this embodiment, the shielding plate 6 is contacted with, and tightly attached to the rear face of the wiring substrate 5, and also firmly connected to the shielding case 4, so that it provides a great effect as a heat radiating plate. Accordingly, it is possible to improve the thermal reliability of the semiconductor devices constituting the high frequency electronic components of the RF signal selection circuit 15 and the broadband amplifier 16.

Embodiment 2

Figure 6:
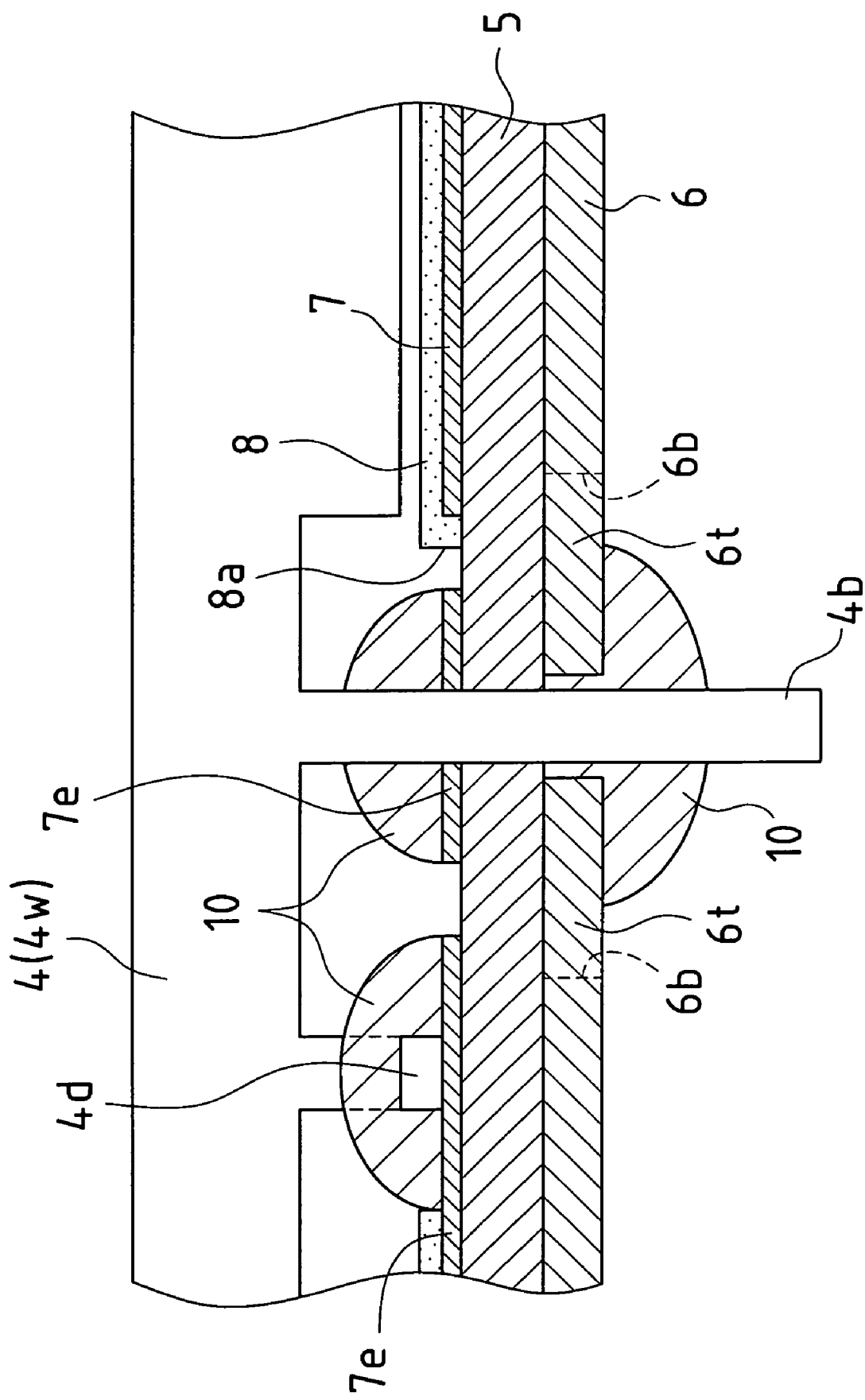
FIG. 6 is a partial cross-sectional view schematically illustrating an example of the connection between a wiring substrate and a shielding plate in a high frequency unit according to Embodiment 2 of the present invention.

FIG. 6 is a partial cross-sectional view schematically illustrating an example of the connection between a wiring substrate and a shielding plate in a high frequency unit according to Embodiment 2 of the present invention. Components identical to those of Embodiment 1 are given identical reference numerals, and their description has been omitted where appropriate.

While a double-sided wiring substrate is used as the wiring substrate 5 in Embodiment 1, it is also possible to use a single-sided wiring substrate, which is less expensive, as the wiring substrate 5, since the shielding plate 6 functions as a very good ground potential. Therefore, a single-sided wiring substrate is used as the wiring substrate 5 in this embodiment. Since the wiring substrate 5 of this embodiment is a single-sided wiring substrate, the shielding plate 6 and the ground land wirings 7e of the wiring substrate 5 are bonded with the solder 10 only on the front face of the wiring substrate 5 via the leg portions 4b passing through the wiring substrate 5. In addition, the leg portions 4b are bonded with the solder 10 to the opening protrusions 6t of the shielding plate 6 on the rear face of the wiring substrate 5.

According to this embodiment, the shielding plate 6 has a greater heat radiating effect than in Embodiment 1. Moreover, it is possible to provide a less expensive high frequency unit, since a single-sided wiring substrate is used as the wiring substrate 5.

The present invention can be embodied and practiced in other different forms without departing from the spirit, gist or essential characteristics thereof Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A high frequency unit comprising:
   a wiring substrate that includes a high frequency semiconductor electronic component mounted on its front face;
   a shielding case that surrounds the wiring substrate to shield the wiring substrate; and
   a shielding plate that contacts a rear face of the wiring substrate to shield the wiring substrate,
   wherein a ground land wiring is provided on the wiring substrate,
   a shielding plate opening is provided in the shielding plate,
   an opening protrusion is provided in the shielding plate opening and is coplanar with the shielding plate, and
   the shielding plate and the ground land wiring are bonded via the opening protrusion,
   wherein a resist film for covering a wiring pattern on the rear face of the wiring substrate is formed on the rear face of the wiring substrate, and
   the shielding plate contacts the wiring substrate via the resist film.

2. The high frequency unit according to claim 1,
   wherein a spacer is formed on the resist film, and
   the shielding plate contacts the wiring substrate via the spacer.

3. The high frequency unit according to claim 1,
   wherein a resist film opening is formed on an outer circumference of the ground land wiring, and
   the shielding plate opening is disposed on an outer circumference of the resist film opening.

4. The high frequency unit according to claim 3,
   wherein the opening protrusion extends inward into the resist film opening.

5. The high frequency unit according to claim 1,
   wherein the shielding case is provided with a leg portion passing through the wiring substrate, and
   the opening protrusion is bonded to the leg portion of the shielding case.

6. The high frequency unit according to claim 1, further comprising
   a fitting portion for fitting the shielding plate and the shielding case to each other.

7. The high frequency unit according to claim 6,
   wherein the fitting portion is composed of a fitting protrusion and a slit,
   the fitting protrusion is formed at the periphery of the shielding plate, and
   the slit is formed in the shielding case into which the fitting protrusion is fitted.

8. The high frequency unit according to claim 7,
wherein the fitting protrusion and the slit are bonded.

9. The high frequency unit according to claim 8,
wherein the shielding plate includes a heat radiating opening at a position corresponding to the fitting protrusion.

10. The high frequency unit according to claim 1,
wherein the shielding case includes a tongue portion, and
the shielding case fixes the shielding plate with the tongue portion.

11. The high frequency unit according to claim 1,
wherein a core wire of each of a high frequency input terminal and a high frequency output terminal are attached to the shielding case, and
the core wire of each of the high frequency input terminal and the high frequency output terminal is bonded to a wiring pattern formed on the front face of the wiring substrate.

12. The high frequency unit according to claim 1,
wherein the shielding case includes a shielding lid for shielding the wiring substrate on the front face side of the wiring substrate.

13. The high frequency unit according to claim 1,
wherein the high frequency semiconductor electronic component is a microwave monolithic integrated circuit.

14. The high frequency unit according to claim 13,
wherein the microwave monolithic integrated circuit constitutes an RF signal selection circuit.

15. The high frequency unit according to claim 1,
wherein a resist film opening is formed on an outer circumference of the ground land wiring, and
the shielding plate opening is disposed on an outer circumference of the resist film opening.

* * * * *